US011347415B2

(12) United States Patent
Rajgopal et al.

(10) Patent No.: US 11,347,415 B2
(45) Date of Patent: *May 31, 2022

(54) SELECTION COMPONENT THAT IS CONFIGURED BASED ON AN ARCHITECTURE ASSOCIATED WITH MEMORY DEVICES

(71) Applicant: Micron Technology, Inc., Boise, ID (US)

(72) Inventors: Suresh Rajgopal, San Diego, CA (US); Henrico L. Yahja, Gold River, CA (US); Steven Eskildsen, Boise, ID (US); Dustin J. Carter, Placerville, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/135,476

(22) Filed: Dec. 28, 2020

(65) Prior Publication Data

US 2021/0117115 A1 Apr. 22, 2021

Related U.S. Application Data

(63) Continuation of application No. 15/982,978, filed on May 17, 2018, now Pat. No. 10,877,678.

(51) Int. Cl.
*G06F 3/06* (2006.01)

(52) U.S. Cl.
CPC .......... *G06F 3/0635* (2013.01); *G06F 3/0604* (2013.01); *G06F 3/0658* (2013.01); *G06F 3/0659* (2013.01); *G06F 3/0679* (2013.01)

(58) Field of Classification Search
CPC .... G06F 3/0635; G06F 3/0604; G06F 3/0658; G06F 3/0659; G06F 3/0679; G06F 3/0629; G06F 3/061; G11C 8/12; G11C 16/08
See application file for complete search history.

(56) References Cited

U.S. PATENT DOCUMENTS

| 4,491,290 A | 1/1985 | Douglas |
| 8,225,006 B1 | 7/2012 | Karamcheti |
| (Continued) | | |

FOREIGN PATENT DOCUMENTS

| WO | 2017075073 | 5/2017 |

OTHER PUBLICATIONS

International Search Report and Written Opinion for International Patent Application Serial No. PCT/US2019/032842, dated Sep. 26, 2019, 14 pages.

*Primary Examiner* — Tasnima Matin
(74) *Attorney, Agent, or Firm* — Lowenstein Sandler LLP

(57) ABSTRACT

A selection device includes a multiplexer component, an input channel configured to couple at least the multiplexer to the memory sub-system controller, and a set of output channels coupled to the multiplexer component. Each of the set of output channels is further coupled to a respective memory device of a set of memory devices. Each of the set of output channels is configured to transmit data between the multiplexer component and the respective memory device. The selection device further includes a decoder component that is coupled to the input channel and each of the set of memory devices. The decoder component is configured to receive, from the memory sub-system controller via the input channel, a signal including a first signal portion configured to enable the decoder component and a second signal portion configured to identify a particular output channel of the set of output channels that is to transmit the (Continued)

data between the multiplexer component and the corresponding memory device. The decoder component is to decode the received signal and transmit the decoded signal to each of the set of memory devices. The decoded signal is to enable the transmission of the data between the multiplexer and the corresponding memory device via the particular output channel.

20 Claims, 7 Drawing Sheets

(56) References Cited

U.S. PATENT DOCUMENTS

| | | |
|---|---|---|
| 2002/0051404 A1 | 5/2002 | Ooishi et al. |
| 2005/0172065 A1 | 8/2005 | Keays |
| 2009/0037641 A1 | 2/2009 | Bresniker |
| 2010/0235590 A1 | 9/2010 | Tam |
| 2012/0117317 A1 | 5/2012 | Sheffler et al. |
| 2013/0166836 A1 | 6/2013 | Berke |
| 2014/0082260 A1 | 3/2014 | Oh et al. |
| 2014/0304560 A1* | 10/2014 | Narasimha .......... G06F 13/1657 714/704 |
| 2017/0038974 A1 | 2/2017 | Keshava |
| 2017/0168752 A1 | 6/2017 | Micheloni et al. |

* cited by examiner

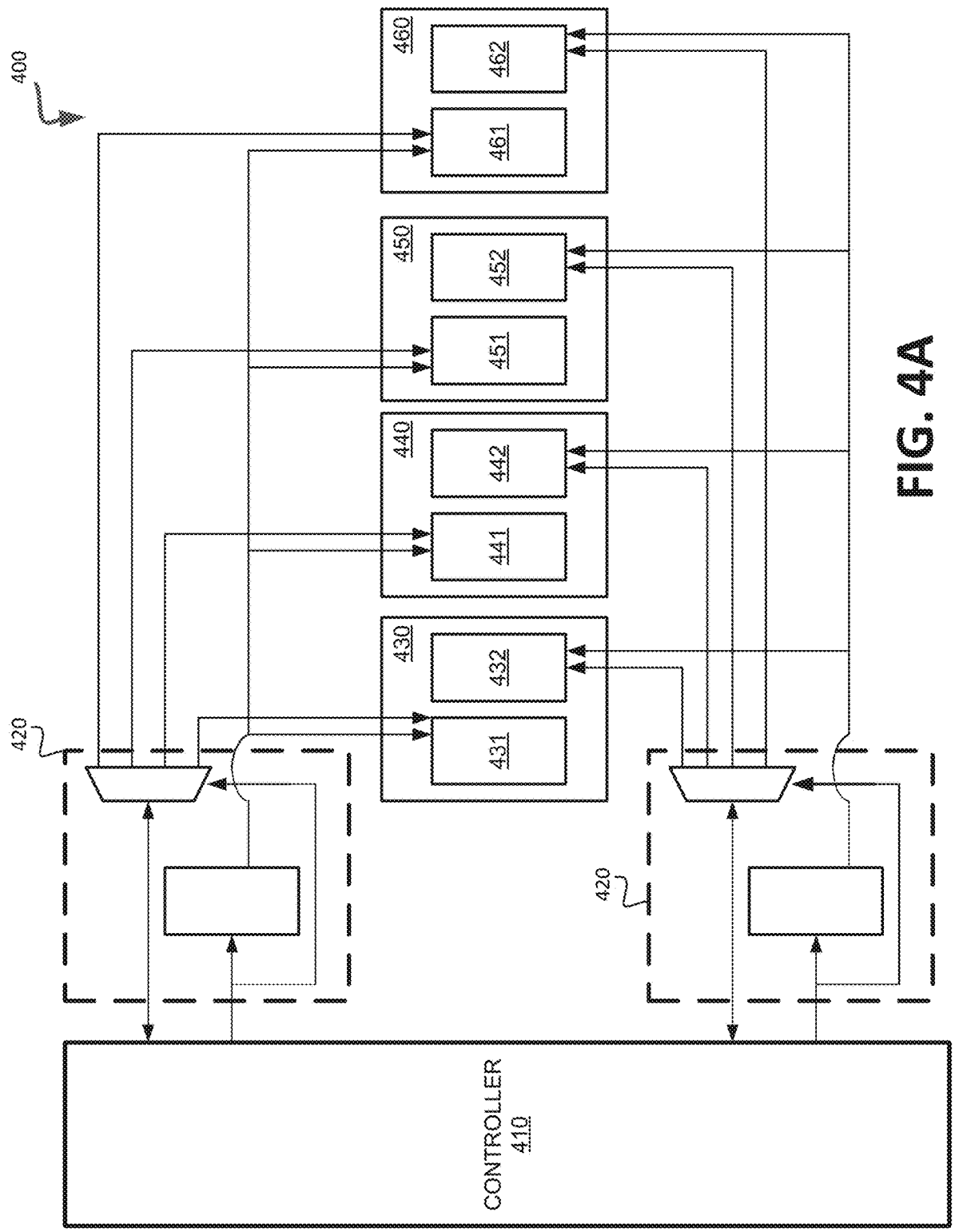

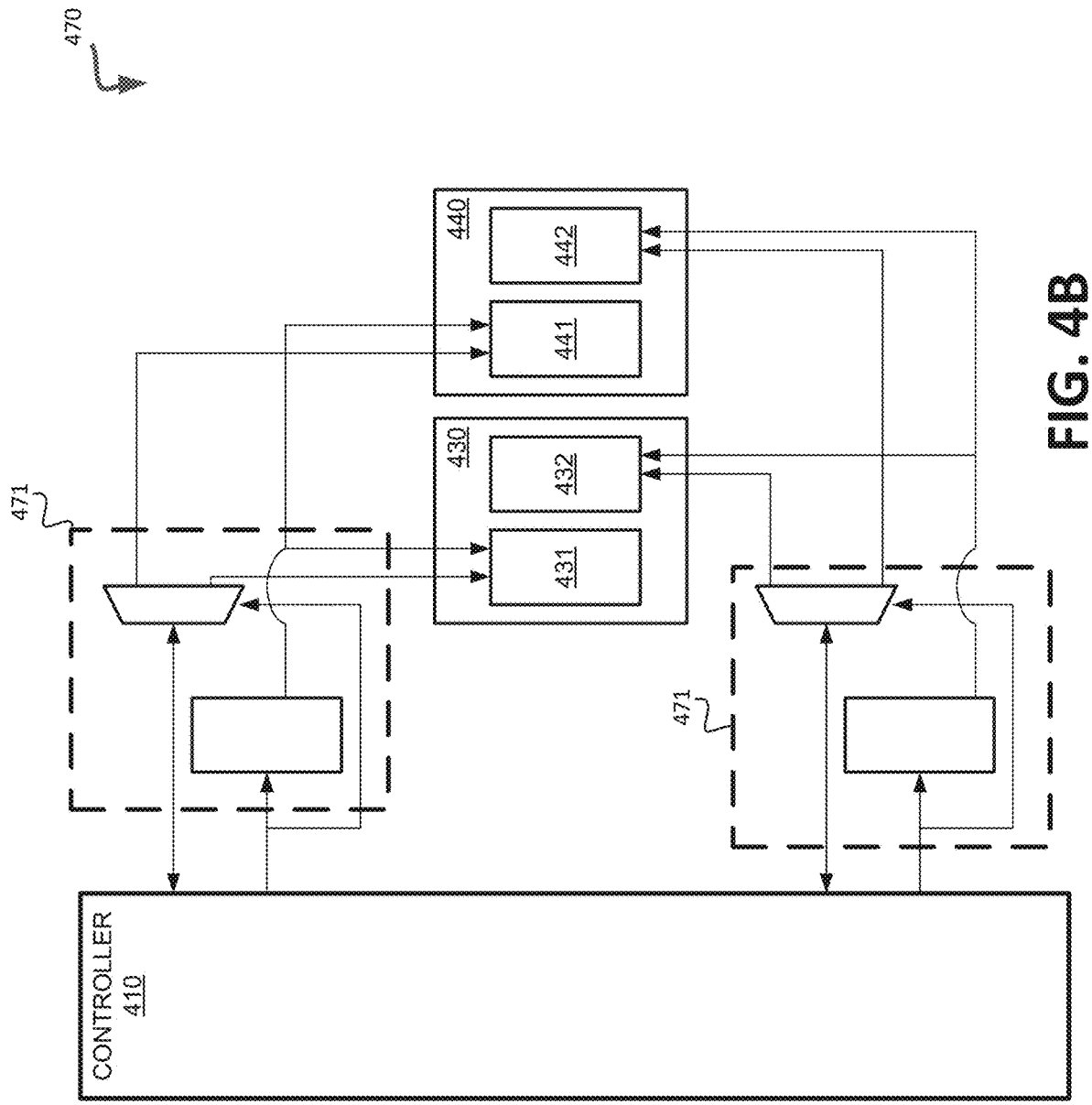

SELECTION COMPONENT THAT IS CONFIGURED BASED ON AN ARCHITECTURE ASSOCIATED WITH MEMORY DEVICES

RELATED APPLICATIONS

This application is a continuation of U.S. patent application Ser. No. 15/982,978, filed May 17, 2018, the entire contents of which is hereby incorporated by reference herein.

TECHNICAL FIELD

The present disclosure generally relates to memory devices, and more specifically, relates to a selection component that is configured based on an architecture associated with memory devices.

BACKGROUND

A memory system can be a storage system, such as a solid-state drive (SSD), and can include one or more memory devices that store data. A memory system can include memory devices such as non-volatile memory devices and volatile memory devices. In general, a host system can utilize a memory system to store data at the memory devices of the memory system and to retrieve data from the memory devices of the memory system.

BRIEF DESCRIPTION OF THE DRAWINGS

The present disclosure will be understood more fully from the detailed description given below and from the accompanying drawings of various implementations of the disclosure.

FIG. 4A is an example architecture with the selection component in a first configuration in accordance with some embodiments of the present disclosure.

FIG. 4B is an example architecture with the selection component in a second configuration in accordance with some embodiments of the present disclosure.

DETAILED DESCRIPTION

Figure 1:
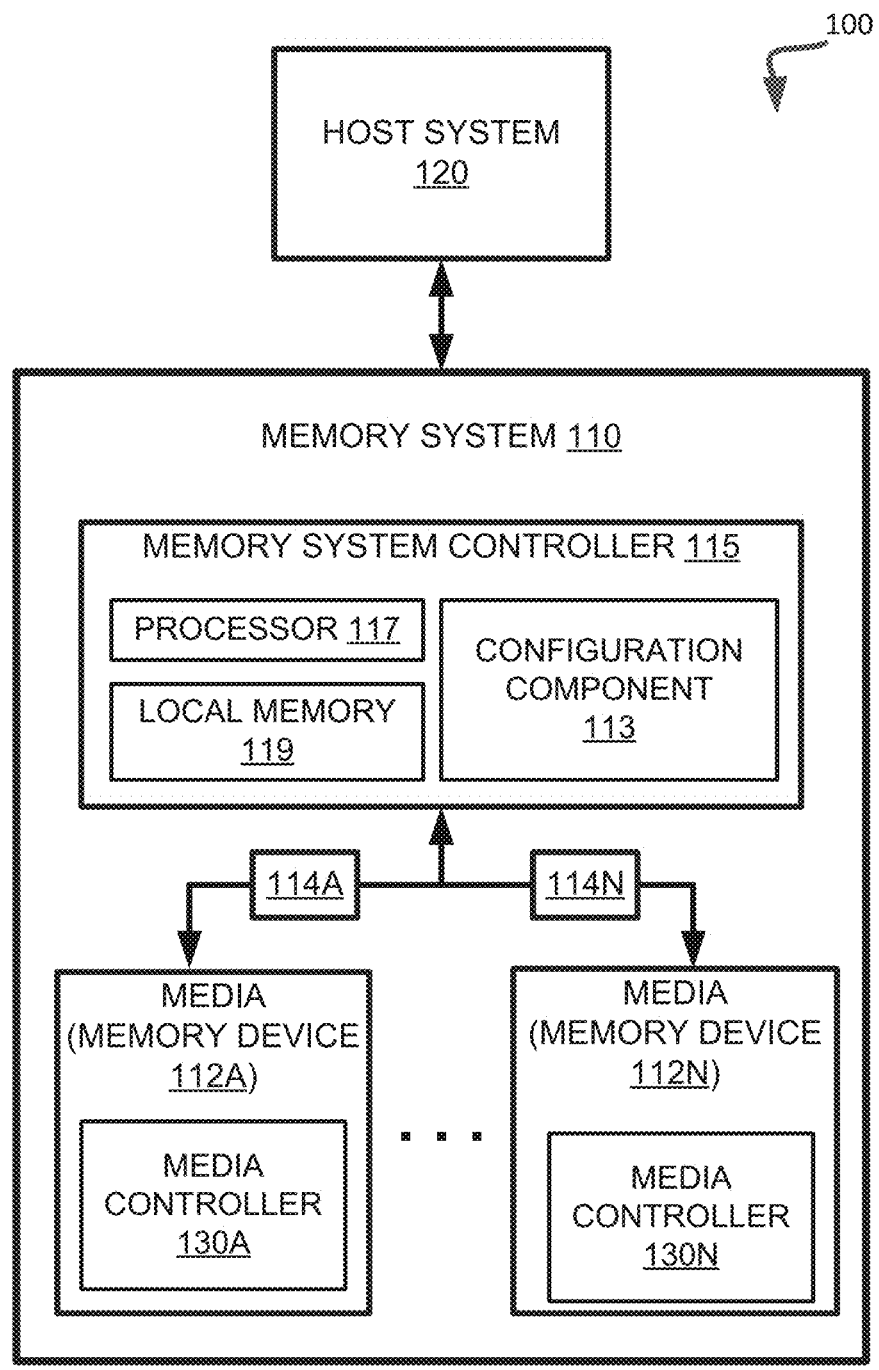
FIG. 1 illustrates an example computing environment that includes a memory system in accordance with some embodiments of the present disclosure.

Aspects of the present disclosure are directed to a selection component that is configured based on an architecture associated with memory devices. In general, a host system can utilize a memory system to store data. The host system can provide write requests to store data at the memory system and can provide read requests to retrieve data stored at the memory system. An example of the memory system is a storage system such as a solid-state drive (SSD) that includes memory devices (e.g., non-volatile memory) and a controller to manage the memory devices. For example, the controller can manage the storing of data at the memory devices by utilizing different channels that interface with the memory devices. A channel can correspond to a portion of the controller and interface components that are used to communicate with a portion of the memory devices.

The capacity of a conventional memory system can be increased by including additional memory devices to the memory system. However, as additional memory devices are added to the conventional memory system, the data rate of its controller (e.g., the speed at which the controller is able to transmit and receive data at the memory devices) for each of the channels can decrease since load characteristics of the controller (e.g., the loading experienced by the controller) will also be increased as more memory devices are coupled with the controller. Such increase in the load characteristics can thus result in a decrease in performance of a conventional memory system as the data rate of the controller to transmit and receive data at the memory devices is decreased.

The design of the conventional controller can be changed so that the load characteristics of the controller will be decreased and the data rate of the controller is maintained as additional memory devices are added. The decreasing of the load characteristics can result from increasing the number of channels on the conventional controller so that each channel of the conventional controller is coupled with a subset or a fewer number of the memory devices in the memory system. For example, each channel can be coupled with four memory devices (e.g., four die of separate memory devices) out of sixteen memory devices that are managed by the controller. However, if the architecture of the memory system is changed at a later time to increase its capacity by adding additional memory devices, then the design of the conventional controller will also be changed to interface with the additional memory devices. Such an implementation of a new design for the controller can require additional design time as the new design can be specific for the changed architecture of the memory system. Additionally, the implementation of the new design of the controller can contribute towards an increased cost for a memory system that utilizes the new design for the controller.

Aspects of the present disclosure address the above and other deficiencies by utilizing a selection component package that is configured based on an architecture associated with memory devices of the memory system. The selection component package can be a device or circuitry that couples the memory devices with a controller of the memory system. The use of the selection component package can reduce the loading of the memory devices that is experienced by the controller while allowing for an increased number of memory devices to be included in the memory system. The selection component package can include a multiplexer and/or a demultiplexer, and a decoder that are used to transmit and receive data to memory devices based on control signals that correspond to the architecture of the memory devices. For example, the multiplexer can receive a first input signal from a first channel of the controller, a second input signal from a second channel of the controller, and enable signals (e.g., chip enable signals) from the controller. Furthermore, the decoder can also receive enable signals from the controller. The inclusion of the decoder in the selection component package can reduce the cost of the memory system as well as reduce an amount of space of the memory system that would be used if the decoder were not included within the selection component package. The enable signals that are generated by the controller can be used to configure the multiplexer and enable or activate certain memory devices. For example, the enable signals can be decoded by the decoder to enable a subset of the memory devices and the enable signals can also be used to select which of the input signals received by the multiplexer should be transmitted to particular memory devices that have been enabled by the output of the decoder.

The selection component package can be configured to operate in different modes corresponding to different architectures of the memory devices. The particular mode that the selection component package is to operate in can be specified at manufacturing of the memory system that includes the selection component package based on the architecture of the memory devices. For example, the selection component package can receive a first set of enable signals to operate in a 1:2 mode where an input from a single channel is received and transmitted to one of two memory devices (or a particular die of one of the two memory devices). Thus, each channel of the controller is configured to operate with two memory devices by using the selection component package. The selection component package can further receive a second set of enable signals to operate in a 1:4 mode where an input from a single channel is received and then transmitted to one of four memory devices. Thus, each channel of the controller can be configured to operate with four memory devices by using the same selection component package that is configured based on different enable signals. Furthermore, the selection component package can receive a third set of enable signals to operate in a 2:4 mode where inputs from two channels are received and then transmitted to different dies of two memory devices. As such, the same selection component package can be operated in different modes or configurations when being used in different architectures of memory devices. Since the selection component package is coupled between the controller and the memory devices, the selection component package can be considered to be a component of a bus interface between the controller and the memory devices.

The use of the selection component package that is configured based on different architectures of the memory devices can maintain or increase data rates of the controller as memory devices are added to the memory system while not resulting in a new design of the controller. For example, the same selection component package can be used in different architectures of memory devices as the selection component package can be configured based on enable signals that correspond to the present architecture of the memory devices that includes the selection component package. Furthermore, since the selection component package is configured based on the requirements of the present architecture that includes the selection component package, the load characteristics of the controller can be reduced and the data rate of the controller increased as each channel of the controller is coupled to communicate with a subset of the memory devices through the configured selection component package. As such, the configurability of the selection component package can allow the use of the selection component package in different memory systems with different architectures without incurring additional costs from redesigning the controller.

FIG. 1 illustrates an example computing environment 100 that includes a memory system 110 in accordance with some implementations of the present disclosure. The memory system 110 can include media, such as memory devices 112A to 112N. The memory devices 112A to 112N can be volatile memory devices, non-volatile memory devices, or a combination of such. In some embodiments, the memory system is a storage system. An example of a storage system is a SSD. In general, the computing environment 100 can include a host system 120 that uses the memory system 110. In some implementations, the host system 120 can write data to the memory system 110 and read data from the memory system 110. In some embodiments, the memory system 110 is a hybrid memory/storage system.

The host system 120 can be a computing device such as a desktop computer, laptop computer, network server, mobile device, or such computing device that includes a memory and a processing device. The host system 120 can include or be coupled to the memory system 110 so that the host system 120 can read data from or write data to the memory system 110. The host system 120 can be coupled to the memory system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory system 110. The host system 120 can further utilize an NVM Express (NVMe) interface to access the memory devices 112A to 112N when the memory system 110 is coupled with the host system 120 by the PCIe interface. The physical host interface can provide an interface for passing control, address, data, and other signals between the memory system 110 and the host system 120.

The memory devices 112A to 112N can include any combination of the different types of non-volatile memory devices and/or volatile memory devices. An example of non-volatile memory devices includes a negative-and (NAND) type flash memory. Each of the memory devices 112A to 112N can include one or more arrays of memory cells such as single level cells (SLCs) or multi-level cells (MLCs) (e.g., triple level cells (TLCs) or quad-level cells (QLCs)). In some implementations, a particular memory device can include both an SLC portion and a MLC portion of memory cells. Each of the memory cells can store bits of data (e.g., data blocks) used by the host system 120. Although non-volatile memory devices such as NAND type flash memory are described, the memory devices 112A to 112N can be based on any other type of memory such as a volatile memory. In some implementations, the memory devices 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross point non-volatile memory can perform a write in-place operation, where a non-volatile memory cell can be programmed without the non-volatile memory cell being previously erased. Furthermore, the memory cells of the memory devices 112A to 112N can be grouped as memory pages or data blocks that can refer to a unit of the memory device used to store data.

The controller 115 can communicate with the memory devices 112A to 112N to perform operations such as reading data, writing data, or erasing data at the memory devices 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory system 110, including handling communications between the memory system 110 and the host system 120. In some embodiments, the local memory 119 can include memory registers storing memory pointers, fetched data, etc. The local memory 119 can also include read-only memory (ROM) for storing micro-code. While the example memory system 110 in FIG. 1 has been illustrated as including the controller 115, in another embodiment of the present disclosure, a memory system 110 may not include a controller 115, and may instead rely upon external control (e.g., provided by an external host, or by a processor or controller separate from the memory system).

In general, the controller 115 can receive commands or operations from the host system 120 and can convert the commands or operations into instructions or appropriate commands to achieve the desired access to the memory devices 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory devices 112A to 112N. The controller 115 can further include host interface circuitry to communicate with the host system 120 via the physical host interface. The host interface circuitry can convert the commands received from the host system into command instructions to access the memory devices 112A to 112N as well as convert responses associated with the memory devices 112A to 112N into information for the host system 120.

The memory system 110 can include a configuration component 113 that can be used to identify an architecture of the memory devices 112A to 112N and can configure selection component packages 114A to 114N based on the identified architecture. The selection component packages 114A to 114N can be used to transmit data from the controller 115 to the non-volatile memory devices 112A to 112N based on an architecture of the non-volatile memory devices 112A to 112N that has been identified by the configuration component 113. The selection component packages 114A to 114N can be in the bus interface between the controller 115 (e.g., a solid-state drive controller) and the non-volatile memory devices 112A to 112N. For example, the selection component packages 114A to 114N can correspond to components of a NAND bus interface of the memory system 110. The selection component packages 114A to 114N can be coupled with different types of memory devices. For example, a selection component package 114A to 114N can be coupled with memory devices (e.g., NAND memory devices) that utilize different protocols. As a result, a particular selection component package 114A to 114N can transmit data to and receive data from different types of memory devices and can support different protocols and/or voltage settings for the different types of memory devices. Further details with regards to the operations of the configuration component 113 and the selection component packages 114A to 114N are described below.

The memory system 110 can also include additional circuitry or components that are not illustrated. In some implementations, the memory system 110 can include a cache or buffer (e.g., DRAM) and address circuitry (e.g., a row decoder and a column decoder) that can receive an address from the controller 115 and decode the address to access the memory devices 112A to 112N.

Figure 2:
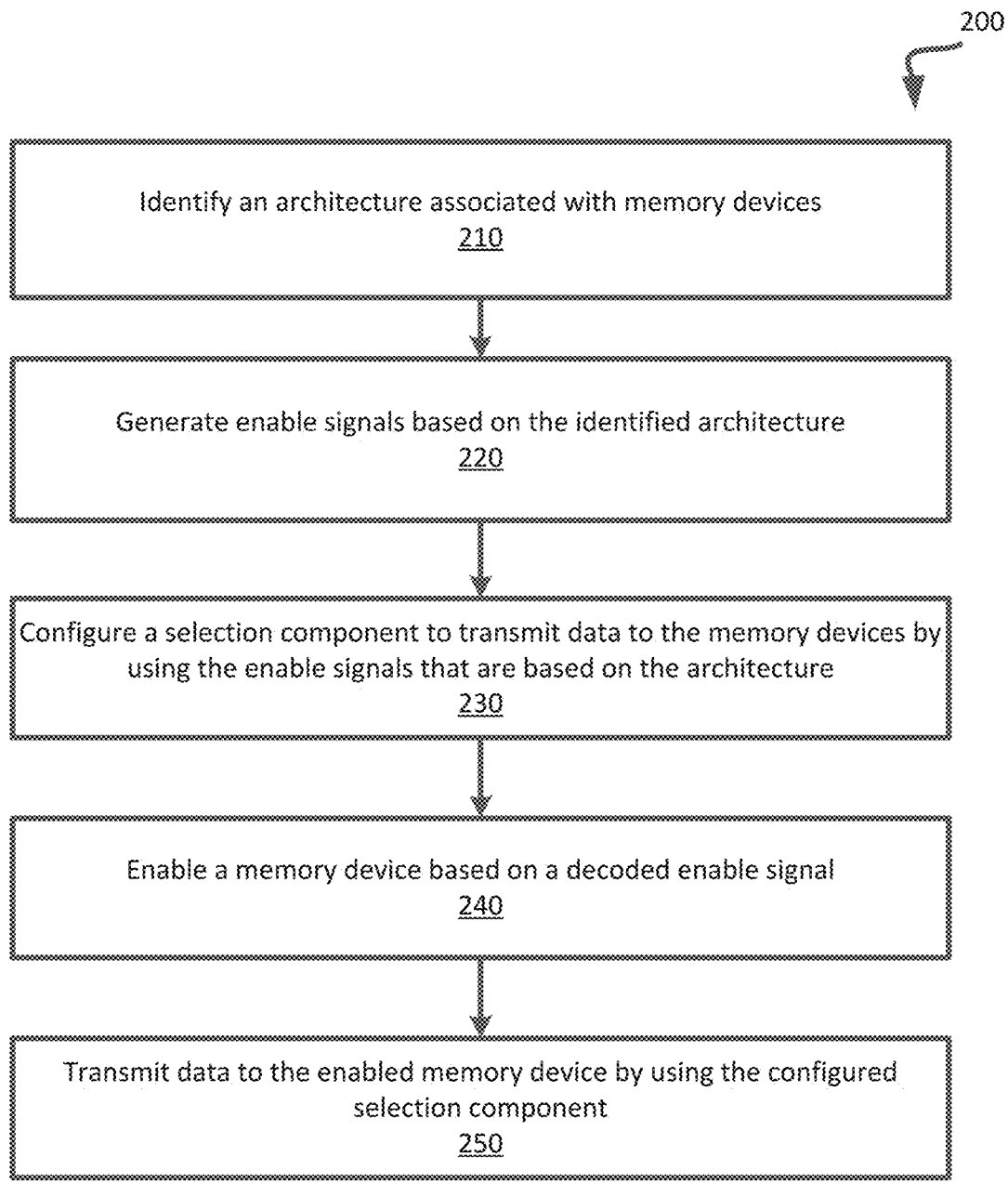
FIG. 2 is a flow diagram of an example method to configure a selection component based on the architecture of memory devices in accordance with some embodiments of the present disclosure.

FIG. 2 is a flow diagram of an example method 200 to configure a multiplexer package based on the architecture of memory devices in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 can be performed by the configuration component 113 of FIG. 1.

As shown in FIG. 2, at block 210, processing logic identifies an architecture associated with memory devices. The architecture can correspond to a configuration of memory devices in a solid-state drive. For example, the architecture can be based on one or more of a number of memory devices that are included in the solid-state drive, a number of selection components that are included in the solid-state drive, and a number of channels used by a controller of the solid-state memory system to transmit and receive data from the memory devices that are included in the solid-state drive. In some embodiments, an identification of a known architecture associated with the memory devices can be stored at the controller. In the same or alternative embodiments, the controller can perform a test to determine the architecture associated with the memory devices. For example, a polling operation can be performed with respect to the inputs and outputs of the controller (e.g., to sense other components such as memory devices and selection components by applying a high voltage signal and a low voltage signal or ground to the inputs and outputs) that are coupled with the controller. At block 220, the processing logic generates enable signals based on the identified architecture. The enable signals can correspond to encoded chip enable (CE) signals that are generated by the controller. At block 230, the processing logic configures a selection component to transmit data to the memory devices by using the enable signals that are based on the architecture associated with the memory devices. For example, the enable signals from the controller can be provided as selection signals to a multiplexer or demultiplexer of the selection component. In some embodiments, the multiplexer or demultiplexer of the selection component can receive multiple input signals that correspond to different channels of the controller and can transmit one of the multiple input signals to one of multiple output signals that are each coupled to a different memory device based on the received enable signals. For example, a particular portion of the enable signals (e.g., a particular bit) that is generated by the controller can be used to enable or activate the selection component and another portion of the enable signals can be used to select one of the multiple input signals and to transmit the selected input signal to one of the memory devices. As such, the enable signals from the controller can be used to configure the selection component so that a particular input signal is transmitted to a particular output that is coupled with a particular memory device. Thus, the enable signals can be to configure the selection component in a particular mode of operation that corresponds to a number of channels that are providing data to the selection component and a number of memory devices that are provided the data from the selection component. Further details with regards to the different configurations or different modes of operation are described in conjunction with FIGS. 4A-4C.

In some embodiments, the selection component can be configured to receive data from the memory devices by using the enable signals. For example, a particular portion of the enable signals that is generated by the controller can enable or activate the selection component and another portion of the enable signals can be used to select a signal from a memory device and to receive data from the selected signal from the memory device at the controller.

Referring to FIG. 2, at block 240, the processing logic enables the memory devices based on a decoded enable signal that is based on the enable signal. For example, a decoder can receive the enable signal from the controller and can generate the decoded enable signal. In some embodiments, the decoded enable signal can be a larger number of bits than the enable signal. In the same or alternative embodiments, another portion of the enable signal can further be used to enable or activate the decoder. The decoded enable signal can be used to enable one of the memory devices while not enabling the other memory devices that are coupled with the selection component. In some embodiments, a memory device that is enabled can be a memory device that is capable of having data read from or written to the memory device and a memory device that is not enabled can be a memory device for which data cannot be read from and data cannot be written to by the controller. The decoded enable signal can enable a single memory device while not enabling the other memory devices coupled with a single selection component. At block 250, the processing logic transmits data to the enabled memory device by using the configured selection component. The transmitted data can be data to be stored at the enabled memory device and an indication of a location of the memory device to store the data or an indication of data stored at a particular location of the memory device that is to be retrieved from the memory device. For example, data can be received from the enabled memory device by using the configured selection component. Thus, the transmitted data can specify instructions to read or write data for the memory devices.

As such, a selection component can be configured to operate in a particular mode of operation that corresponds to a number of input signals that are received and transmitted to a number of outputs that are coupled to a number of memory devices. The configuration of the selection component can be based on the architecture associated with the memory devices.

Figure 3:
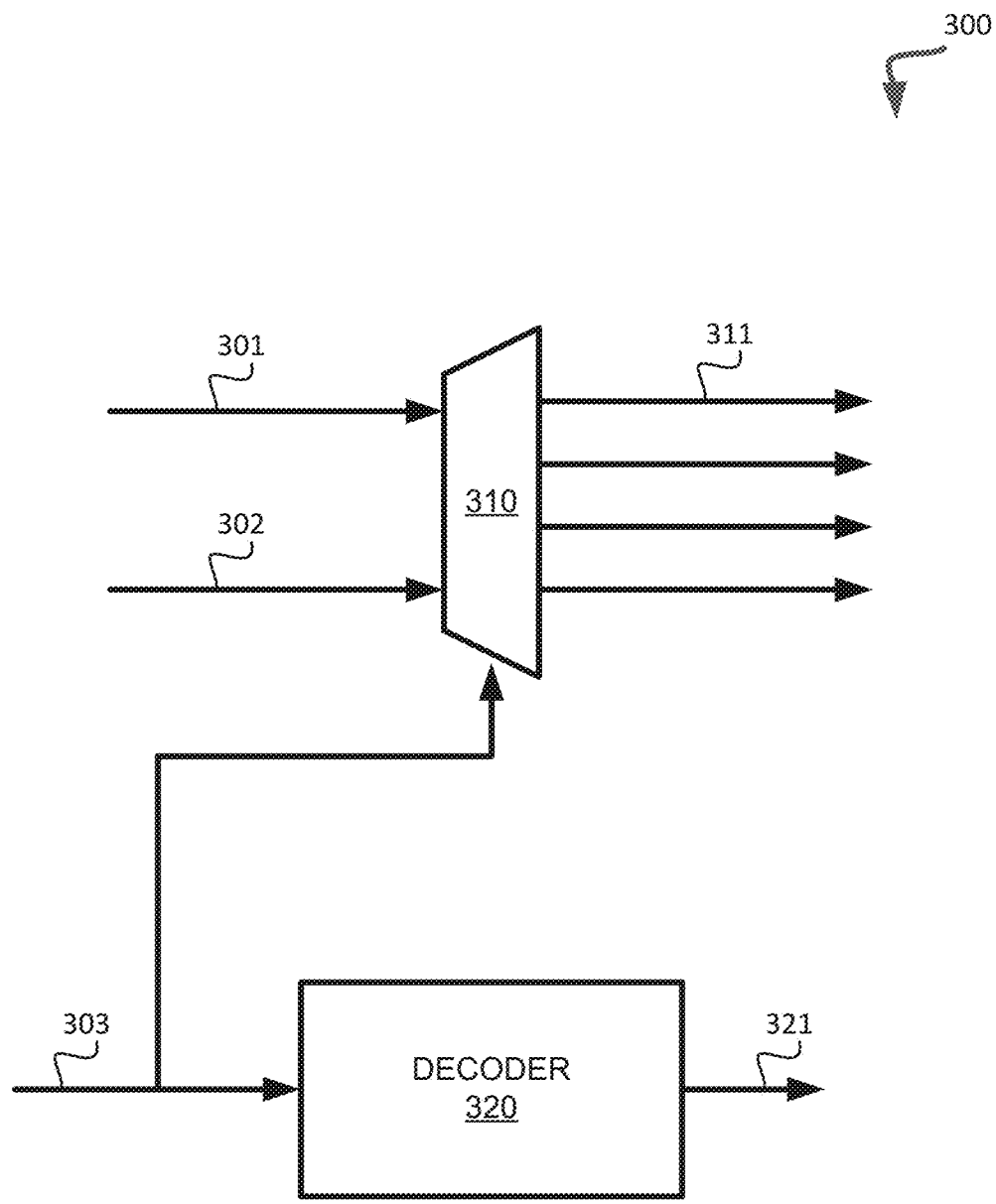
FIG. 3 illustrates an example selection component in accordance with some embodiments of the present disclosure.

FIG. 3 illustrates an example selection component 300 in accordance with some embodiments of the present disclosure. The selection component 300 includes a multiplexer/demultiplexer component 310 and a decoder 320 in accordance with some embodiments of the present disclosure. The selection component 300 can correspond to one of the selection components 114A to 114N of FIG. 1.

As shown in FIG. 3, the multiplexer/demultiplexer component 310 is capable of being coupled to a first input 301 and a second input 302. The multiplexer/demultiplexer component 310 can provide a multiplexer functionality when transmitting data to memory devices and a demultiplexer functionality when receiving data from the memory devices. The first input 301 can correspond to a first channel of the controller and the second input 302 can correspond to a second channel of the controller. The multiplexer/demultiplexer component 310 can further include outputs 311. Each of the outputs 311 can be capable of being coupled to a different memory device. Depending on the mode of operation of the selection component when the selection component 300 is configured, one or both of the first input 301 and the second input 302 can couple or receive data from a channel of the controller to the selection component 300 and two or four of the outputs 311 can couple the selection component 300 to two or four of the memory devices. In some embodiments, each of the first input 301 and the second input 302 can be sixteen bits in size and the outputs 311 can be sixteen bits in size. Furthermore, an enable signal 303 from a controller can be received by the multiplexer/demultiplexer component 310 and the decoder 320. A number of bits of the enable signal 303 can be used to enable the multiplexer/demultiplexer component 310 and as selection signals for the multiplexer/demultiplexer component 310. For example, the enable signal 303 can be four bits where one of the bits of the enable signal 303 (e.g., the fourth bit) can be used to enable or activate the multiplexer/demultiplexer component 310 and two of the bits (e.g., the second and third bits) can be used as selection signals to determine which of the first input 301 or the second input 302 to select and to transmit over one of the outputs 311. Thus, the selection signals can be used to select a particular channel of the controller (e.g., the first input 301 or the second input 302) for which data is to be received and to transmit the data to one of the memory devices (e.g., via one of the outputs 311 that is coupled to the particular memory device).

The decoder 320 can further receive the enable signal 303 from the controller and can perform a decoding operation on the enable signal 303 to generate a decoded enable signal 321. In some embodiments, the decoded enable signal 321 can be eight bits (e.g., the decoded enable signal 321 includes more bits than the enable signal 303). The decoded enable signal 321 can be provided to memory devices so that one of the memory devices can be enabled at a particular time. For example, the decoded enable signal 321 can enable one memory device while leaving other memory devices disabled or inactive. For example, different bits of the decoded enable signal 321 can be provided to each of the memory devices so that a value of the bits provided to one of the memory devices enables one of the memory devices (e.g., a value of '1') and the other values of the bits provided to the other memory devices are different and do not enable the other memory devices (e.g., a value of '0'). In some embodiments, the decoder 320 can further use a bit of the enable signal 303 to activate or enable the decoder 320 to perform the decoding operation.

As such, the enable signal 321 from the controller can be used to enable or activate a particular memory device by using the decoder 320 as well as using the enable signal 321 to determine which input signal is to be transmitted to which output signal by using the multiplexer/demultiplexer component 310.

In operation, a controller can generate the enable signal 303 and can provide the first input 301 or the second input 302 or both the first and second inputs 301 and 302. The decoder 320 can perform a decoding operation to generate the decoded enable signal 321 to enable one of the memory devices that is coupled to one of the outputs 311 that one of the first input 301 or second input 302 is transmitted to.

In some embodiments, bus hold circuitry and pull up resistors can be included in the selection component 300. Thus, the selection component 300 can include an integrated decoder, bus hold circuitry, and pull up resistors with the multiplexer/demultiplexer. The bus hold circuitry can hold or store a last driven state of several bits on a bus interface when the selection component package switches from transmitting data to receiving data (or vice versa). The pull up resistors can pull or transition certain signals (e.g., enable signals) of the selection component package to a non-controlling state so that unnecessary switching does not occur downstream when the selection component package is not being used. Since these portions are included within the selection component 300, the selection component 300 can be considered to utilize less space within a memory system as opposed to when each of the various decoder, bus hold circuitry, and pull up resistors are separately placed within the memory system.

FIG. 4A is an example of an example architecture 400 with selection components in a first configuration or a first mode of operation in accordance with some embodiments of the present disclosure. A selection component 420 of the architecture 400 can correspond to one of the selection components 114A to 114N of FIG. 1.

As shown in FIG. 4A, the selection component 420 used in the architecture 400 can operate in a 1:4 configuration or mode of operation where a single selection component is coupled to a single channel of the controller 410 and four memory devices 430, 440, 450, and 50460. For example, a first selection component can be coupled to a first channel of the controller 410 and memory dies 431, 441, 451, and 461 of the memory devices 430, 440, 450, and 460 and a second selection component can be coupled to a second channel of the controller and memory dies 432, 442, 452, and 462 of the memory devices 430, 440, 450, and 460. Thus, each channel of the controller 410 uses a different selection component 420 to receive and transmit data from the portions or dies of the memory devices that are assigned to the corresponding channel of the controller 410.

FIG. 4B is an example architecture 470 with the selection component in a second configuration in accordance with some embodiments of the present disclosure. The selection component of the architecture 470 can correspond to one of the selection components 114A to 114N of FIG. 1.

As shown in FIG. 4B, the selection components in the architecture 470 can operate in a 1:2 configuration or mode of operation where the selection component is coupled to a different number of memory devices than the selection components 420 and 421 of the architecture 400. For example, each selection component 471 can be coupled to a single channel from the controller 410 and two memory devices. For example, a first selection component can be coupled to a first channel of the controller 410 and memory dies 431 and 441 of the memory devices 430 and 440 and a second selection component can be coupled to a different second channel of the controller 410 and memory dies 432 and 442 of the memory devices 430 and 440. Thus, the selection component can be configured to communicate with a fewer number of memory devices when in the second configuration than when the selection component is in the first configuration. In some embodiments, since the selection component and a channel of the controller 410 is coupled to a fewer number of memory devices, the data rate of the controller 410 will be higher than the data rate of the controller 410 if the selection component was coupled to an increased number of memory devices.

Figure 4C:
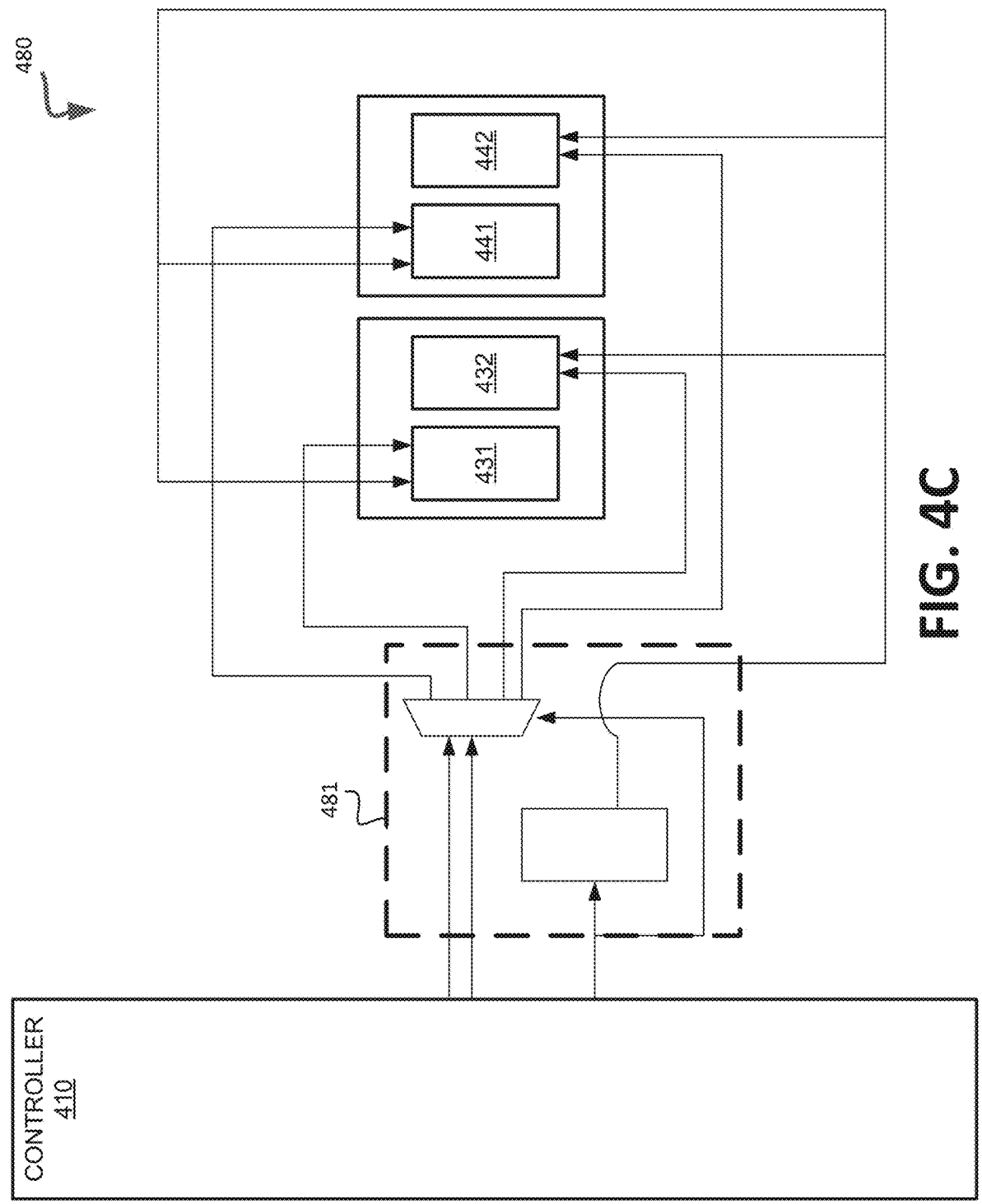
FIG. 4C is an example architecture with the selection component in a third configuration in accordance with some embodiments of the present disclosure.

FIG. 4C is an example architecture 480 with the selection component in a third configuration in accordance with some embodiments of the present disclosure. The selection component of the architecture 480 can correspond to one of the selection components 114A to 114N of FIG. 1.

As shown in FIG. 4C, the selection component 481 used in the architecture 480 can operate in a 2:4 configuration or mode of operation where a single selection component 481 is coupled to multiple channels of the controller 410 and two memory devices 430 and 440. For example, a first channel and a second channel of the controller 410 can be inputs to the selection component 481 and the outputs of the selection component 481 can be the four dies 431, 432, 441, and 442 at two of the memory devices 430 and 440. The selection component 481 can be used to transmit data from the first channel to dies 431 and 441 of the memory devices 430 and 440 while the data from the second channel can be transmitted to the dies 432 and 442 of the same memory devices 430 and 440. Thus, a single selection component can be used to route or transmit data to memory devices for multiple channels of the controller 410. Although two channels are shown as being coupled to the selection component, any number of channels and/or memory devices can be coupled with different types of selection components of the present disclosure.

As such, a same design of a selection component can be used in different architectures of a memory system that includes memory devices. The selection component can be operated in different configurations or modes based on the different architectures.

Figure 5:
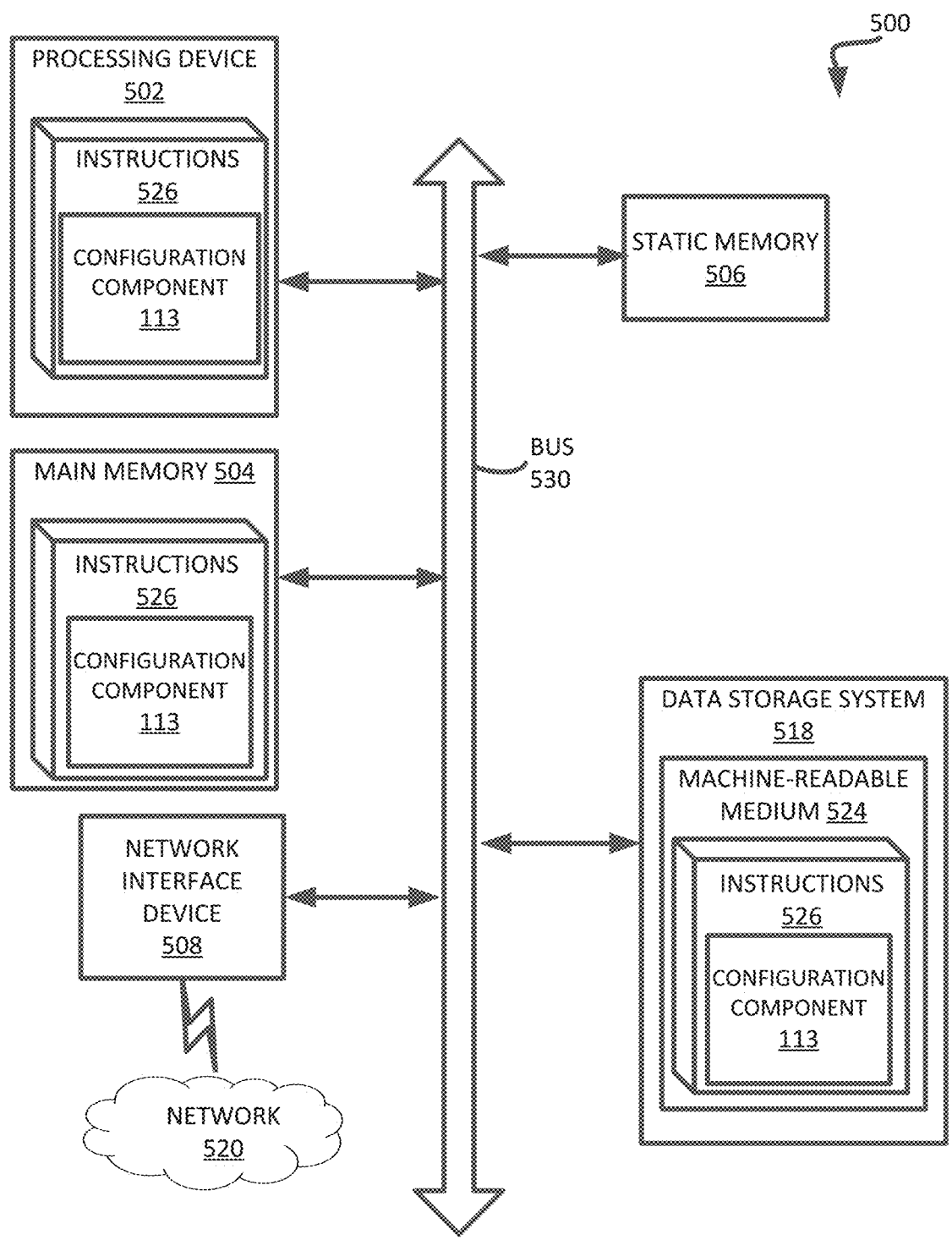
FIG. 5 is an example architecture of a memory system with memory devices and selection components in accordance with some embodiments.

FIG. 5 illustrates an example machine of a computer system 500 within which a set of instructions, for causing the machine to perform any one or more of the methodologies discussed herein, can be executed. In some implementations, the computer system 500 can correspond to a host system (e.g., the host system 120 of FIG. 1) that includes or utilizes a memory system (e.g., the memory system 110 of FIG. 1) or can be used to perform the operations of a controller (e.g., to execute an operating system to perform operations corresponding to the configuration component 113 of FIG. 1). In alternative implementations, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions or software 526 embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory system 110 of FIG. 1.

In one implementation, the instructions 526 include instructions to implement functionality corresponding to a configuration component (e.g., the configuration component 113 of FIG. 1). While the machine-readable storage medium 524 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some implementations, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications can be made thereto without departing from the broader spirit and scope of implementations of the disclosure as set forth in the following claims. The specification and drawings are, accordingly, to be regarded in an illustrative sense rather than a restrictive sense.

What is claimed is:

1. A selection device comprising:
   a multiplexer component;
   an input channel configured to couple at least the multiplexer component to a memory sub-system controller;
   a plurality of output channels coupled to the multiplexer component, wherein each of the plurality of output channels is further coupled to a respective memory device of a plurality of memory devices, and wherein each of the plurality of output channels is configured to transmit data between the multiplexer component and the respective memory device; and a decoder component coupled to the input channel and each of the plurality of memory devices, wherein the decoder component is configured to perform operations comprising:

receiving, from the memory sub-system controller via the input channel, a signal comprising a first signal portion configured to enable the decoder component and a second signal portion configured to identify a particular output channel of the plurality of output channels that is to transmit the data between the multiplexer component and a corresponding memory device;

decoding the received signal; and transmitting the decoded signal to each of the plurality of memory devices, wherein the decoded signal is to enable transmission of the data between the multiplexer component and the corresponding memory device via the particular output channel.

2. The selection device of claim 1, wherein the signal further comprises a third signal portion configured to enable the multiplexer component, and wherein the multiplexer component is configured to perform operations comprising:

receiving the signal from the memory sub-system controller via the input channel;

identifying, in view of the second signal portion and the third signal portion, the particular output channel of the plurality of output channels that is to transmit the data between the multiplexer component and the corresponding memory device;

receiving the data to be transmitted by the multiplexer component to the corresponding memory device from the memory sub-system controller via the input channel; and transmitting the data received from the memory sub-system controller to the corresponding memory device via the particular output channel.

3. The selection device of claim 2, wherein the multiplexer component is configured to perform operations further comprising:

transmitting the data received from the memory sub-system controller to the corresponding memory device in response to detecting that the corresponding memory device is enabled in response to receiving the decoded signal from the decoder component.

4. The selection device of claim 1, wherein the input channel configured to couple the multiplexer component to the memory sub-system controller is a first input channel, and wherein the selection device further comprises:

a second input channel configured to couple the multiplexer component to the memory sub-system controller.

5. The selection device of claim 4, wherein the signal further comprises a fourth signal portion configured to identify the first input channel or the second input channel to transmit data between the memory sub-system controller and the multiplexer component, and wherein the multiplexer component is configured to perform operations further comprising:

determining, in view of the fourth signal portion, whether the first input channel or the second input channel is to transmit the data between the memory sub-system controller and the multiplexer component;

identifying, in view of the second signal portion, the particular output channel of the plurality of output channels that is to transmit the data between the multiplexer component and the corresponding memory device; and transmitting the data received from the memory sub-system controller via the determined input channel to the corresponding memory device via the identified output channel.

6. The selection device of claim 4, wherein the signal is associated with a first configuration for the selection device, the first configuration corresponding to first data from the first input channel and second data from the second input channel being received by the multiplexer component and transmitted to the plurality of memory devices.

7. The selection device of claim 1, wherein the signal is associated with a second configuration for the selection device, the second configuration corresponding to data from a single channel of the memory sub-system controller being received by the multiplexer component and transmitted to a first number of the plurality of memory devices.

8. A method comprising:

receiving, by a decoder component of a selection device, a signal via an input channel configured to couple a memory sub-system controller to the decoder component and a multiplexer component of the selection device, wherein the signal comprises a first signal portion configured to enable the decoder component and a second signal portion configured to identify a particular output channel of a plurality of output channels that is to transmit data between the multiplexer component and a respective memory device of a plurality of memory devices;

decoding, by the decoder component, the received signal;

transmitting, by the decoder component, the decoded signal to each of the plurality of memory devices, wherein the decoded signal is configured to enable the respective memory device; and initiating, by the multiplexer component, transmission of the data between the multiplexer component and the respective memory device via the particular output channel.

9. The method of claim 8, wherein the signal further comprises a third signal portion configured to enable the multiplexer component, and wherein the method further comprises:

receiving, by the multiplexer component, the signal from the memory sub-system controller via the input channel; and identifying, by the multiplexer component and in view of the second signal portion and the third signal portion, the particular output channel of the plurality of output channels that is to transmit data between the multiplexer component and the respective memory device.

10. The method of claim 9, wherein initiating transmission of the data between the multiplexer component and the respective memory device comprises:

receiving, by the multiplexer component, the data to be transmitted by the multiplexer component to the respective memory device from the memory sub-system controller via the input channel; and transmitting, by the multiplexer component, the data received from the memory sub-system controller to the respective memory device via the particular output channel.

11. The method of claim 8, wherein the multiplexer component is to initiate the transmission of the data received from the memory sub-system controller to the respective memory device responsive to detecting that the respective memory device is enabled in response to receiving the decoded signal from the decoder component.

12. The method of claim 8, wherein the input channel configured to couple the decoder component and the multiplexer component to the memory sub-system controller is a first input channel and the selection device further comprises a second input channel configured to couple the multiplexer component to the memory sub-system controller.

13. The method of claim 12, wherein the signal further comprises a fourth signal portion configured to identify the first input channel or the second input channel to transmit data between the memory sub-system controller and the multiplexer component, and wherein the method further comprises:
  determining, by the multiplexer component and in view of the fourth signal portion, whether the first input channel or the second input channel is to transmit the data between the memory sub-system controller and the multiplexer component;
  identifying, by the multiplexer component and in view of the second signal portion, the particular output channel of the plurality of output channels that is to transmit the data between the multiplexer component and the respective memory device; and
  transmitting, by the multiplexer component, the data received from the memory sub-system controller via the determined input channel to the respective memory device via the identified output channel.

14. The method of claim 12, wherein the signal is associated with a first configuration for the selection device, the first configuration corresponding to first data from the first input channel and second data from the second input channel being received by the multiplexer component and transmitted to the plurality of memory devices.

15. The method of claim 8, wherein the signal is associated with a second configuration for the selection device, the second configuration corresponding to data from a single channel of the memory sub-system controller being received by the multiplexer component and transmitted to a first number of the plurality of memory devices.

16. A non-transitory computer-readable storage medium comprising instructions that, when executed by a processing device, cause the processing device to perform operations comprising:
  receiving, by a decoder component of a selection device, a signal via an input channel configured to couple a memory sub-system controller to the decoder component and a multiplexer component of the selection device, wherein the signal comprises a first signal portion configured to enable the decoder component and a second signal portion configured to identify a particular output channel of a plurality of output channels that is to transmit data between the multiplexer component and a respective memory device of a plurality of memory devices;
  decoding, by the decoder component, the received signal;
  transmitting, by the decoder component, the decoded signal to each of the plurality of memory devices, wherein the decoded signal is configured to enable the respective memory device; and
  initiating, by the multiplexer component, transmission of the data between the multiplexer component and the respective memory device via the particular output channel.

17. The non-transitory computer-readable storage medium of claim 16, wherein the signal further comprises a third signal portion configured to enable the multiplexer component, and wherein the processing device performs operations further comprising:
  receiving, by the multiplexer component, the signal from the memory sub-system controller via the input channel; and
  identifying, by the multiplexer component and in view of the second signal portion and the third signal portion, the particular output channel of the plurality of output channels that is to transmit data between the multiplexer component and the respective memory device.

18. The non-transitory computer-readable storage medium of claim 17, wherein initiating transmission of the data between the multiplexer component and the respective memory device comprises:
  receiving, by the multiplexer component, the data to be transmitted by the multiplexer component to the respective memory device from the memory sub-system controller via the input channel; and
  transmitting, by the multiplexer component, the data received from the memory sub-system controller to the respective memory device via the particular output channel.

19. The non-transitory computer-readable storage medium of claim 16, wherein the multiplexer component is to initiate the transmission of the data received from the memory sub-system controller to the respective memory device responsive to detecting that the respective memory device is enabled in response to receiving the decoded signal from the decoder component.

20. The non-transitory computer-readable storage medium of claim 16, wherein the input channel configured to couple the decoder component and the multiplexer component to the memory sub-system controller is a first input channel and the selection device further comprises a second input channel configured to couple the multiplexer component to the memory sub-system controller.

* * * * *